US009564286B2

(12) United States Patent
Kim et al.

(10) Patent No.: US 9,564,286 B2
(45) Date of Patent: Feb. 7, 2017

(54) METHOD OF FORMING THIN FILM OF SEMICONDUCTOR DEVICE

(71) Applicant: Samsung Electronics Co., Ltd., Suwon-si, Gyeonggi-do (KR)

(72) Inventors: Sam Hyung Sam Kim, Suwon-si (KR); Andrei Teodor Iancu, Stanford, CA (US); Friedrich B. Prinz, Palo Alto, CA (US); Michael C. Langston, Stanford, CA (US); Peter Schindler, Stanford, CA (US); Ki-Hyun Kim, Yongin-si (KR); Stephen P. Walch, Palo Alto, CA (US); Takane Usui, Stanford, CA (US)

(73) Assignees: Samsung Electronics Co., Ltd., Gyeonggi-Do (KR); The Board of Trustees of the Leland Stanford Junior University, Palo Alto, CA (US)

( * ) Notice: Subject to any disclaimer, the term of this patent is extended or adjusted under 35 U.S.C. 154(b) by 134 days.

(21) Appl. No.: 14/459,644

(22) Filed: Aug. 14, 2014

(65) Prior Publication Data
US 2016/0049291 A1 Feb. 18, 2016

(51) Int. Cl.
*B05D 3/06* (2006.01)
*H01J 37/00* (2006.01)
*H01J 37/32* (2006.01)
*C23C 16/455* (2006.01)
*H01L 21/768* (2006.01)

(52) U.S. Cl.
CPC ......... *H01J 37/00* (2013.01); *C23C 16/45536* (2013.01); *H01J 37/321* (2013.01); *H01J 37/32183* (2013.01); *H01J 37/32339* (2013.01); *H01J 37/32357* (2013.01); *H01L 21/76898* (2013.01); *H01L 21/76831* (2013.01)

(58) Field of Classification Search
CPC ............ H01L 21/0228; H01L 21/3141; H01L 21/02274; H01L 21/67207; H01L 21/02277; H01L 21/02315; H01L 21/02348; H01L 21/263; H01L 21/268; H01L 21/2686
See application file for complete search history.

(56) References Cited

U.S. PATENT DOCUMENTS

| 7,964,039 | B2 | 6/2011 | Urbanowicz et al. |
| 2004/0157430 | A1* | 8/2004 | Mandal ............... C23C 16/5096 438/636 |

(Continued)

FOREIGN PATENT DOCUMENTS

| KR | 100642390 B1 | 11/2006 |
| KR | 20090055443 A | 6/2009 |

*Primary Examiner* — Bradley K Smith
*Assistant Examiner* — David Goodwin
(74) *Attorney, Agent, or Firm* — Harness, Dickey & Pierce, P.L.C.

(57) ABSTRACT

Provided is a method of forming a thin film of a semiconductor device. The method includes forming a precursor layer on a surface of a substrate by supplying a precursor gas into a chamber, discharging the precursor gas remaining in the chamber to an outside of the chamber by supplying a purge gas into the chamber, supplying a reactant gas into the chamber, generating plasma based on the reactant gas, forming a thin film by a chemical reaction between plasma and the precursor layer and radiating extreme ultraviolet (EUV) light into the chamber, and discharging the reactant gas and the plasma remaining in the chamber by supplying a purge gas into the chamber.

12 Claims, 22 Drawing Sheets

(56) References Cited

U.S. PATENT DOCUMENTS

2011/0226745 A1    9/2011  Nagai et al.
2015/0064361 A1*  3/2015  Greer ................ C23C 16/45536
                                                           427/509

* cited by examiner

METHOD OF FORMING THIN FILM OF SEMICONDUCTOR DEVICE

BACKGROUND

Field

Example embodiments of the inventive concepts relate to methods of forming a thin film of a semiconductor device.

Description of Related Art

An atomic layer deposition (ALD) process is a process of forming a thin film by sequentially supplying a precursor gas, a purge gas, a reactant gas, and a purge gas. As a reactant gas, an oxidant, such as ozone or oxygen plasma, can be used. However, when ozone is used as the oxidant, yield may be low since a large amount of ozone should be injected into a chamber in order to fully react with precursors. When oxygen plasma is used as the oxidant, oxygen radicals generated by oxygen plasma may be recombined, resulting in occurrence of anisotropic deposition.

SUMMARY

Some example embodiments of the inventive concepts provide methods of forming a thin film having an improved thickness uniformity and/or step coverage in semiconductor devices.

Example embodiments of the inventive concepts are not limited to the above disclosure; other variations may become apparent to those of ordinary skill in the art based on the following descriptions.

In accordance with at least one example embodiment of the inventive concepts, a method of forming a thin film of a semiconductor device may include forming a precursor layer on a surface of a substrate by supplying a precursor gas into a chamber, discharging the precursor gas remaining in the chamber to an outside of the chamber by supplying a purge gas into the chamber, supplying a reactant gas into the chamber, generating plasma based on the reactant gas, forming a thin film using a chemical reaction between the plasma and the precursor layer and radiating extreme ultraviolet (EUV) light into the chamber, and discharging the reactant gas and the plasma remaining in the chamber by supplying a purge gas into the chamber.

A time period for the generating plasma may be shorter than the time period for the supplying a reactant gas.

A starting point of the time period for the generating plasma may be later than a starting point of the time period for the supplying a reactant gas.

A time for the radiating EUV light into the chamber may be same as the time period for the generating plasma.

A EUV lamp may maintain an on-state during the time period for the generating plasma.

A EUV lamp may repeat turning on and off during the time period for the generating plasma to radiate the EUV light into the chamber in an alternating manner.

A time period for the radiating EUV light into the chamber may be shorter than the time period for the generating plasma.

A starting point of the time period for the radiating EUV light into the chamber may be later than the starting point of the time period for the generating plasma.

A starting point of the time period for the radiating EUV light into the chamber may be same as the starting point of the time period for the generating plasma.

A EUV lamp may maintain an on-state during the time period for the generating plasma.

A EUV lamp may repeat turning on and off during the time period for the generating plasma to radiate the EUV light into the chamber in an alternating manner.

The EUV light may include a Lyman-alpha line.

In accordance with at least one example embodiment of the inventive concepts, a method of forming a thin film of a semiconductor device may include forming a precursor layer on a surface of a, discharging the precursor gas remaining in the chamber to an outside of the chamber, supplying a reactant gas into the chamber, forming a thin film by a chemical reaction between the reactant gas and the precursor layer while radiating extreme ultraviolet (EUV) light into the chamber.

A time period for the radiating EUV light into the chamber may be shorter than a time period for the supplying a reactant gas.

The EUV light may include a Lyman-alpha line.

In accordance with at least one example embodiment of the inventive concepts, a method of forming a thin film of a semiconductor device may include forming a precursor layer on a substrate in a chamber, supplying a reactant gas onto the substrate to form plasma, and forming a thin film by a reaction between the precursor layer and radicals included in the plasma while radiating extreme ultraviolet (EUV) light into the chamber.

A time period for the forming plasma may be shorter than a time period for supplying a reactant gas.

A starting point of the generating plasma may be later than a starting point of the supplying a reactant gas.

A EUV lamp may maintain an on-state or alternate between on and off states during a time period for the forming plasma.

The reactant gas may include at least one of water ($H_2O$), ozone ($O_3$) and oxygen ($O_2$). Details of other example embodiments are included in the following detailed description and accompanying drawings.

BRIEF DESCRIPTION OF THE DRAWINGS

The foregoing and other features and advantages of the inventive concepts will be apparent from the more particular description of some example embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings.

DETAILED DESCRIPTION OF EXAMPLE EMBODIMENTS

Figure 1A:
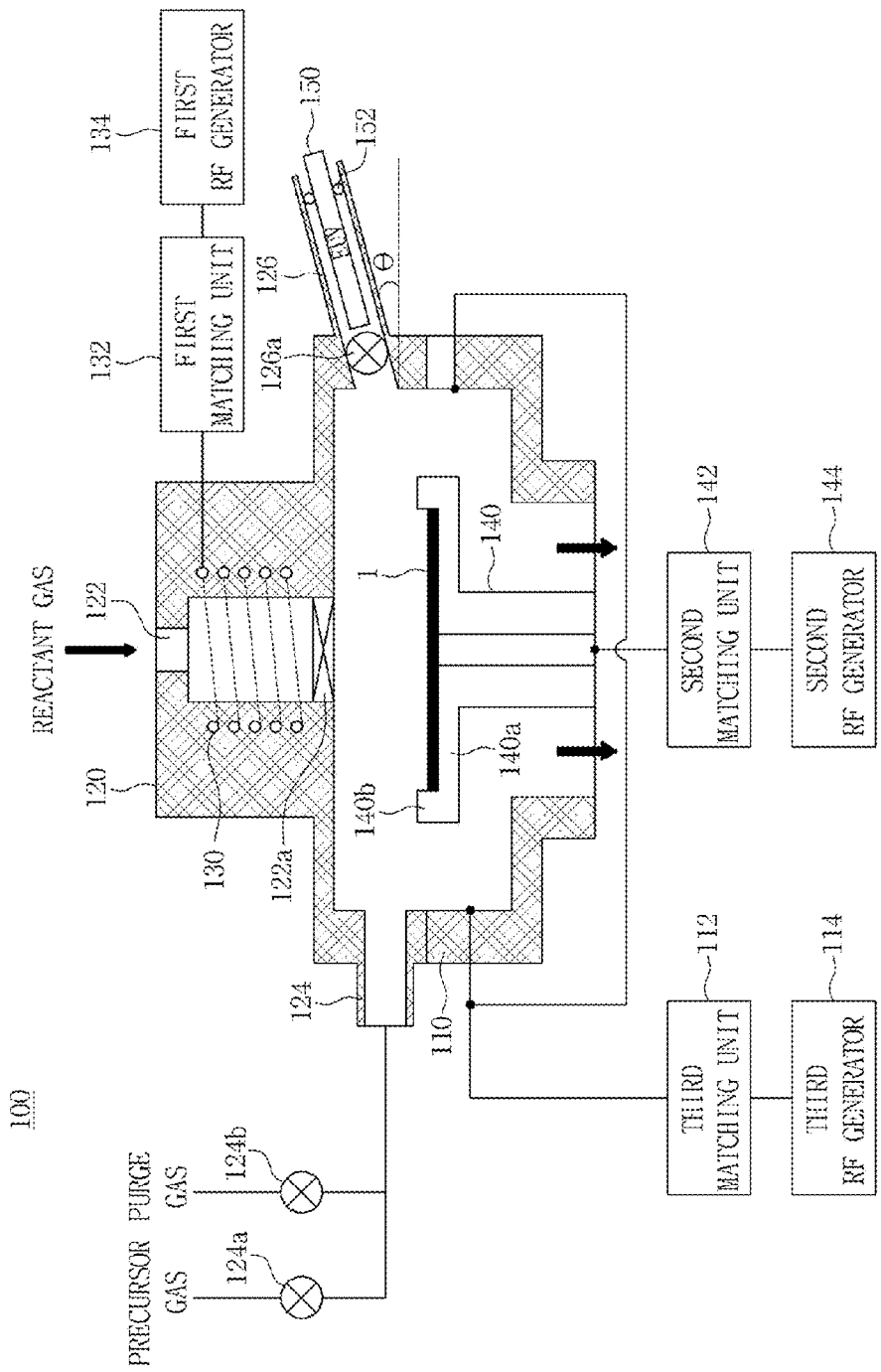
FIG. 1A is a vertical cross-sectional view showing a thin film forming apparatus in accordance with an example embodiment of the inventive concepts.

Various example embodiments will now be described more fully with reference to the accompanying drawings in which some example embodiments are shown. However, the inventive concepts should not be construed as limited to the example embodiments disclosed hereinafter. Thus, example embodiments of the inventive concepts may be implemented in various forms. The example embodiments of the inventive concepts are merely provided so that this disclosure will be thorough and complete, and will fully convey the scope of the inventive concepts to those skilled in the art.

The terminologies used herein to describe some example embodiments of the inventive concepts are not intended to limit the scope of the inventive concepts. The use of the singular form in the present disclosure should not be construed to preclude the presence of more than one referent. In other words, an element of the example embodiments referred to as having the singular form may refer to more than one element, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "connected to" or "coupled to" another element or layer, it can be connected or coupled to the other element or layer or intervening elements or layers may be present. In contrast, when an element is referred to as "directly connected to" or "directly coupled to" another element or layer, there are no intervening elements or layers present. The term "and/or" includes any and all combinations of one or more referents.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Some of example embodiments are described herein with reference to cross-sectional views and/or plan views that are schematic illustrations of idealized example embodiments and intermediate structures. As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an etched region illustrated as a rectangle will, typically, have features that are rounded or have a desired (or alternatively, predetermined) curvature. Thus, the regions illustrated in the figures are schematic in nature and their shapes are not intended to illustrate the actual shape of a region of a device and are not intended to limit the scope of the present inventive concepts.

The same reference numerals denote the same elements throughout the specification. Accordingly, the same numerals and similar numerals can be described with reference to other drawings, even if not specifically described in a corresponding drawing. Further, when a numeral is not marked in a drawing, the numeral can be described with reference to other drawings.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, some example embodiments will be explained in further detail with reference to the accompanying drawings.

FIG. 1A is a vertical cross-sectional view showing a thin film forming apparatus 100 in accordance with an example embodiment of the inventive concepts.

Referring to FIG. 1A, the thin film forming apparatus 100 in accordance with the example embodiment of the inventive concepts may include a chamber 110 defining a space in which a substrate 1 is disposed, and a chamber cover 120 covering the chamber 110.

The chamber cover 120 may cover the chamber 110. The chamber cover 120 may be formed of, for example, a stainless steel. The chamber cover 120 may include two or more inlet ports.

The chamber cover 120 may include a first inlet port 122. The first inlet port 122 may be disposed at an upper portion of the chamber cover 120. The first inlet port 122 may be disposed perpendicular to the substrate 1. A reactant gas may be injected into the first inlet port 122. The reactant gas may be injected into the first inlet port 122 and supplied into the chamber 110 through a reactant gas control valve 122a. When the reactant gas is injected into the first inlet port 122, the reactant gas control valve 122a may be opened and a precursor gas control valve 124a and a purge gas control valve 124b, which will be described later, may be closed.

An inductively coupled plasma (ICP) coil 130 for generating plasma from the reactant gas may be disposed on an outer circumferential surface of the first inlet port 122. The ICP coil 130 may be wound along the outer circumferential surface of the first inlet port 122, and disposed in the chamber cover 120.

A first matching unit 132 may be connected to the ICP coil 130, and a first RF generator 134 may be connected to the first matching unit 132. The first RF generator 134 may be operated, for example, at about 13.56 MHz and 400 W. The first matching unit 132 may compensate a difference in impedance between the first RF generator 134 and the ICP coil 130. When power is applied to the first RF generator 134 while the reactant gas is injected into the first inlet port 122, a high frequency current may flow in the ICP coil 130, and a magnetic field is generated around the ICP coil 130. Then, an electric field may be induced by the generated magnetic field in the chamber 110. Thus, electrons may be accelerated by the induced electric field, thereby generating plasma from the reactant gas.

The chamber cover 120 may include a second inlet port 124. The second inlet port 124 may be disposed at a side of the chamber cover 120, for example, a left side of the chamber cover 120. The second inlet port 124 may be arranged at a higher position than the substrate 1. The second inlet port 124 may be arranged parallel to the substrate 1. A precursor gas or a purge gas may be injected into the second inlet port 124. The precursor gas may be injected into the second inlet port 124 through the precursor gas control valve 124a. The purge gas may be injected into the second inlet port 124 through the purge gas control valve 124b. When the precursor gas is injected into the second inlet port 124, the precursor gas control valve 124a may be opened, and the reactant gas control valve 122a and the purge gas control valve 124b may be closed. When the purge gas is injected into the second inlet port 124, the purge gas control valve 124b may be opened, and the precursor gas control valve 124a and the reactant gas control valve 122a may be closed.

The chamber cover 120 may include a third inlet port 126. The third inlet port 126 may be disposed on the other side of the chamber cover 120, for example, a right side of the chamber cover 120. The third inlet port 126 may be arranged at a higher position than the substrate 1. According to an example embodiment of the inventive concepts, the third inlet port 126 may form a desired (or alternatively, predetermined) angle (A) with respect to the substrate 1. Further, an EUV lamp 150 generating extreme ultraviolet (EUV) light may be placed in the third inlet port 126. It is known that photons generated in the EUV lamp 150 may be difficult to reach the substrate 1 placed in the chamber 110 if the photons has to pass through (e.g., travel through) air. Thus, by placing the EUV lamp 150 in the third inlet port 126, the photons generated in the EUV lamp 150 can be directly supplied to the substrate 1 without traveling through air. When a diameter of the EUV lamp 150 is smaller than that of the third inlet port 126, a packing 152 for sealing a gap between an outer surface of the EUV lamp 150 and an inner surface of the third inlet port 126 may be further disposed.

The EUV lamp 150 may include, for example, a hydrogen resonance type lamp. For example, the EUV lamp 150 may operate at a condition of about 60 W and 2453 MHz, and reflected power may be about 30 W. The EUV may include, for example, a Lyman-alpha line. A wavelength of the Lyman-alpha line is 121.6 nm.

The EUV light generated in the EUV lamp 150 may be radiated toward the plasma generated from the reactant gas. As described above, because the third inlet port 126 may form the desired (or alternatively, predetermined) angle θ with respect to the substrate 1, the EUV light radiated toward the plasma may be reflected by the substrate 1. The EUV light reflected by the substrate 1 may be radiated back toward the plasma over the substrate 1.

Although FIG. 1A shows a case in which the third inlet port 126 forms a desired (or alternatively, predetermined) angle with respect to the substrate 1, example embodiments are not limited thereto. In accordance with another example embodiment of the inventive concepts, the third inlet port 126 may be arranged at a higher position than the substrate 1 while being arranged parallel to the substrate 1. In accordance with still another example embodiment of the inventive concepts, the third inlet port 126 may be arranged at an upper portion of the chamber cover 120. For example, the third inlet port 126 may be arranged at the upper portion of the chamber cover 120 while being perpendicular to the substrate 1.

A EUV control valve 126a may be disposed in the third inlet port 126 in a direction in which EUV light is radiated. When the EUV control valve 126a is opened, EUV light generated in the EUV lamp 150 may be radiated to the substrate 1. When the EUV control valve 126a is closed, the EUV light generated in the EUV lamp 150 may be blocked from reaching the substrate 1. Further, when the EUV control valve 126a is closed, the EUV lamp 150 can be protected from gases existing in the chamber 110 while the EUV lamp 150 is not used. In accordance with another example embodiment of the inventive concepts, the EUV control valve 126a may be omitted. When the EUV control valve 126a is omitted, the EUV light toward the plasma in the chamber 110 may be radiated or blocked by turning on or off a power source of the EUV lamp 150.

A susceptor 140 may be disposed in the chamber 110. The susceptor 140 may include a supporting area 140a supporting the substrate 1, and a peripheral area 140b surrounding the substrate 1. The susceptor 140 may be implemented to be rotatable. In accordance with some example embodiments of the inventive concepts, a process of forming a thin film may be performed while the susceptor 140 does not rotate or while the susceptor 140 rotates. A thin film having better thickness uniformity may be obtained when the susceptor 140 rotates than when the susceptor 140 does not rotate.

A second matching unit 142 may be connected to the susceptor 140, and a second RF generator 144 may be connected to the second matching unit 142. The second RF generator 144 may apply a vertical bias to the substrate 1. The second matching unit 142 may compensate a difference in impedance between the second RF generator 144 and the susceptor 140.

A third matching unit 112 may be connected to a sidewall of the chamber 110, and a third RF generator 114 may be connected to the third matching unit 112. The third RF generator 114 may apply a horizontal bias to the substrate 1. The third matching unit 112 may compensate a difference in impedance between the third RF generator 114 and the sidewall of the chamber 110.

So far, a structure of the thin film forming apparatus 100 in accordance with an example embodiment of the inventive concepts has been described with reference to FIG. 1A. Next, a structure of a thin film forming apparatus 1000 in accordance with another example embodiment of the inventive concepts will be described with reference to FIG. 1B.

Figure 1B:
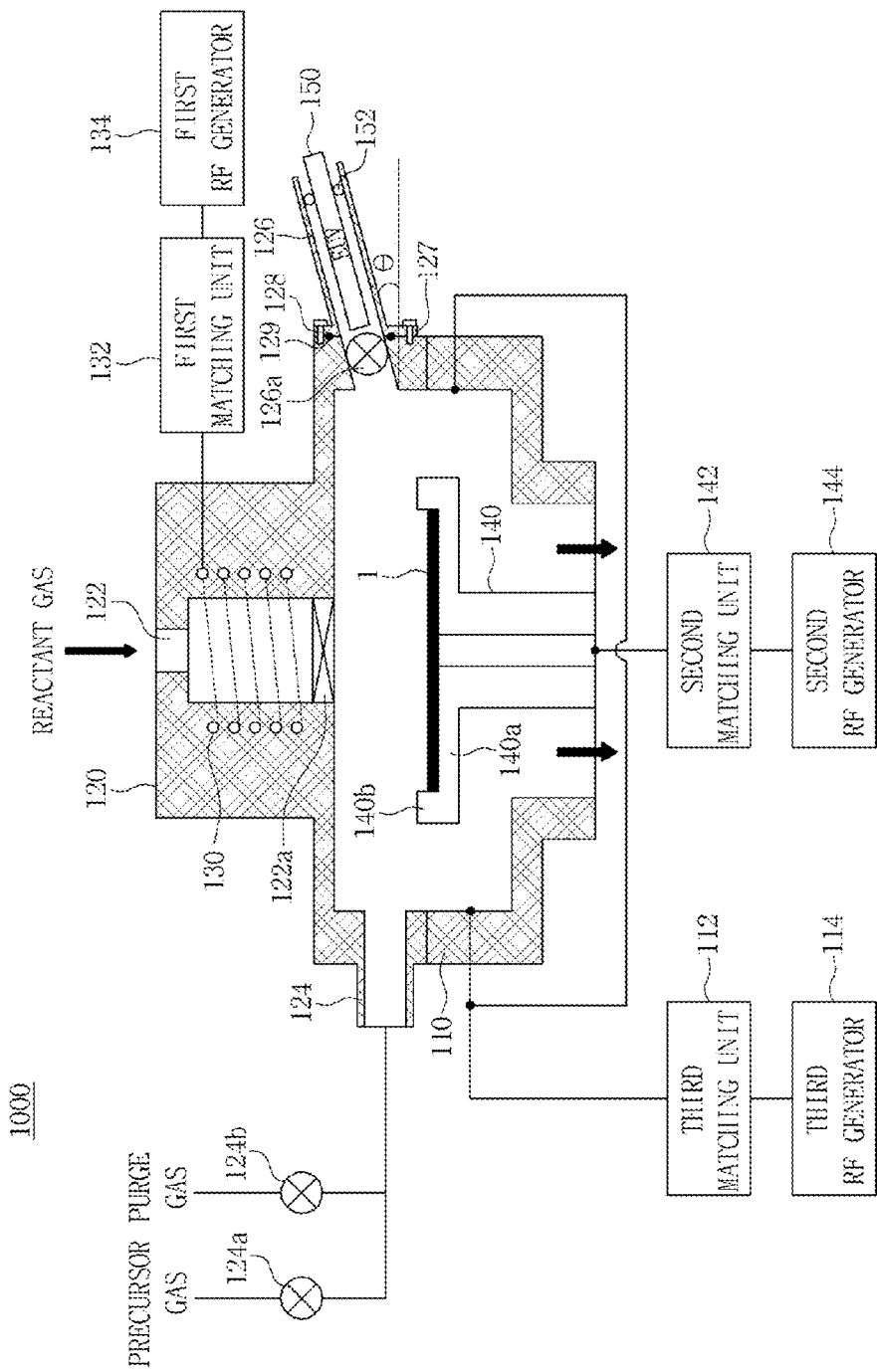
FIG. 1B is a vertical cross-sectional view showing a thin film forming apparatus in accordance with another example embodiment of the inventive concepts.

FIG. 1B is a vertical cross-sectional view of the thin film forming apparatus 1000 in accordance with the other example embodiment of the inventive concepts.

Referring to FIG. 1B, a structure of the thin film forming apparatus 1000 in accordance with the other example embodiment of the inventive concepts is similar to the structure of the thin film forming apparatus 100 described in FIG. 1A. However, a third inlet port 126 of the thin film forming apparatus 1000 shown in FIG. 1B can be detachably attached to a chamber cover 120, whereas the third inlet port 126 of the thin film forming apparatus 100 shown in FIG. 1A forms a fixed integral body with the chamber cover 120. The detachable third inlet port 126 may facilitate easy maintenance and/or replacement.

More specifically, referring to FIG. 1B, a flange 127 may be disposed on an end of the third inlet port 126. The flange 127 may be combined to an outer wall of the chamber cover 120 by a connecting member 128. For example, the connecting member 128 may include a bolt. A packing 129 for sealing a gap between the outer wall of the chamber cover 120 and the flange 127 may be further disposed between the outer wall of the chamber cover 120 and the flange 127.

So far, structures of the thin film forming apparatuses 100 and 1000 in accordance with some example embodiments of the inventive concepts have been described with reference to FIGS. 1A and 1B. A thin film can be formed using an atomic layer deposition (ALD) method or a plasma enhanced atomic layer deposition (PEALD) method in the thin film forming apparatuses 100 and 1000 described with reference to FIGS. 1A and 1B.

Figure 1C:
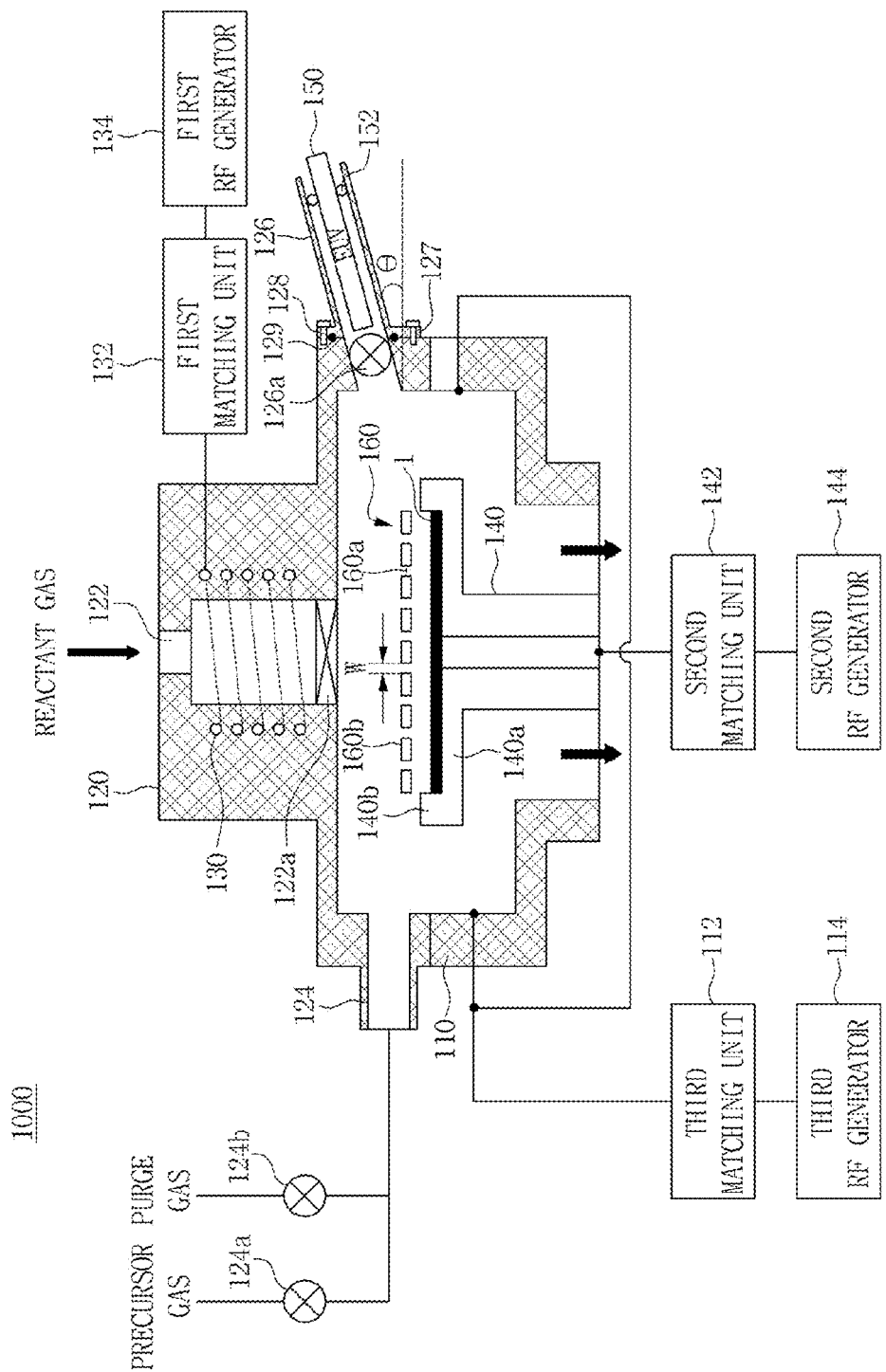
FIG. 1C is a vertical cross-sectional view of a thin film forming apparatus according to at least one example embodiment of the inventive concepts.

Further, in the above-described thin film forming apparatuses 100 and 1000, a thin film can be selectively formed using a lithography process as described in FIG. 1C. In order to selectively form a thin film on a surface of the substrate 1, a shadow mask 160 may be used. The shadow mask 160 may include an opened area 160a and a closed area 160b. In this way, when the shadow mask 160 is disposed on the substrate 1, a thin film may be selectively formed on a portion corresponding to the opened area 160a of shadow mask 160 on the surface of substrate 1. A width W of the opened area 160a may depend on a wavelength of EUV light. This is because the EUV light may be diffracted while passing through the opened area 160a of the shadow mask 160. For example, the width W of the opened area 160a of the shadow mask 160 may be about 100 nm or more.

Hereinafter, thin film forming methods using the PEALD method in the thin film forming apparatus 100 described in FIG. 1A will be described.

Figure 2:
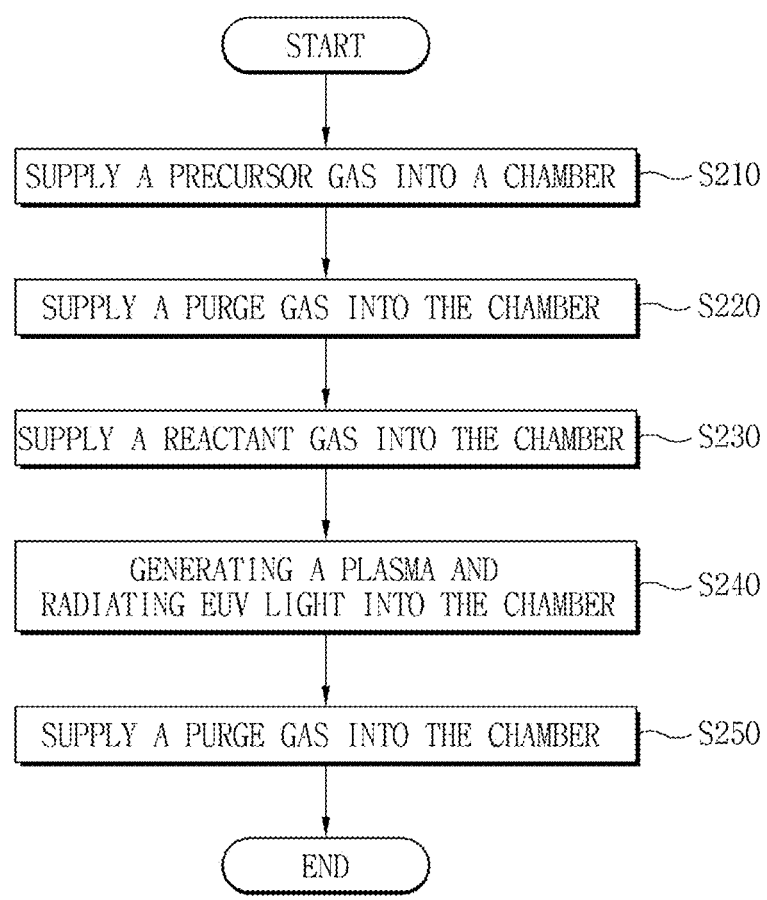
FIG. 2 is a flowchart showing a method of forming a thin film in accordance with an example embodiment of the inventive concepts, and more specifically, a flowchart showing a method of forming a thin film using a plasma enhanced atomic layer deposition (PEALD) method.

FIG. 2 is a flowchart showing a method of forming a thin film in accordance with an example embodiment of the inventive concepts. More specifically, FIG. 2 is a flowchart showing a method of forming a thin film using the PEALD method.

The substrate 1 may be loaded in the chamber 110, and a precursor gas may be supplied into the chamber 110 (S210). The precursor gas may be supplied into the chamber 110 via the precursor gas control valve 124a and the second inlet port 124. When the precursor gas is supplied into the chamber 110, a process condition including, for example, a flow rate (sccm), pressure (torr), and time (s) of the precursor gas and a temperature (° C.) of the substrate 1 may be determined according to a type or types of the precursor gas. The precursor gas supplied into the chamber 110 may react with a surface of the substrate 1 and may be chemically adsorbed to a surface of the substrate 1. Once the precursor gas is adsorbed to the surface of the substrate 1, no more reaction takes place on the surface of the substrate 1 even when an excessive precursor gas is supplied into the chamber 110.

Then, the supply of the precursor gas may be stopped and a purge gas may be supplied into the chamber 110 (S220). The purge gas may be supplied into the chamber 110 via the purge gas control valve 124b and the second inlet port 124. As the purge gas, argon (Ar) or nitrogen ($N_2$), which is an inert gas, may be used. When the purge gas is supplied into the chamber 110, the precursor gas remaining in the chamber 110 may be discharged to an outside of the chamber 110 by the purge gas.

Next, the supply of the purge gas may be stopped, and a reactant gas may be supplied into the chamber 110 (S230). The reactant gas may be supplied into the chamber 110 via the reactant gas control valve 122a and the first inlet port 122. As the reactant gas, water ($H_2O$), ozone ($O_3$), or oxygen ($O_2$), which is an oxidant, may be used. When oxygen is used as the reactant gas, high purity oxygen, for example, 99.999% pure oxygen can be used.

While the reactant gas is supplied, plasma may be generated from the reactant gas by applying power to the first RF generator 134, and EUV light (which spans from 124 nm down to 10 nm) may be radiated into the chamber 110 by applying power to the EUV lamp 150 (S240). When the EUV light is radiated, a thin film having an excellent isotropy may be formed on the substrate 1 having a nanostructure due to extended lifetimes of radicals generated by plasma.

For example, when oxygen is used as the reactant gas, oxygen plasma may be generated when power is applied to the first RF generator 134. The generated oxygen plasma may diffuse around the substrate 1, and oxygen radicals generated by the oxygen plasma may react with precursors adsorbed to the surface of the substrate 1 to form a thin film. Because the oxygen radicals have strong reactivity, reaction time can be undesirably short.

However, oxygen radicals have relatively short diffusion lengths, for example, in structures having a high aspect ratio (e.g., a nanotrench). Because the oxygen radicals recombine so quickly and so easily, anisotropic deposition may occur on the nanostructured substrate 1. In accordance with at least one example embodiment of the inventive concepts, oxygen radicals are retarded from being recombined and/or the recombined oxygen radicals can be dissociated by radiating the EUV light into the chamber 110. Accordingly, effective lifetimes of oxygen radicals can be extended. Because the effective lifetimes of oxygen radicals that have a relatively strong reactivity can be extended by radiating the EUV light, a thin film having an improved isotropy can be formed on the nanostructured substrate 1. Further, the oxygen radicals can react with certain ALD precursors with no activation energy barrier. As a result, oxygen radicals can have a relatively wide thermal processing window.

Next, all processes of supplying the reactant gas, generating plasma, and radiating EUV light may be stopped, and a purge gas may be supplied into the chamber 110 (S250). The purge gas may be supplied into the chamber 110 via the purge gas control valve 124b and the second inlet port 124. As the purge gas, an inert gas (e.g., argon (Ar) or nitrogen (N2)) may be used. When the purge gas is supplied into the chamber 110, the reactant gas and plasma remaining in the chamber 110 may be discharged to the outside of the chamber 110 by the purge gas.

Figure 3:
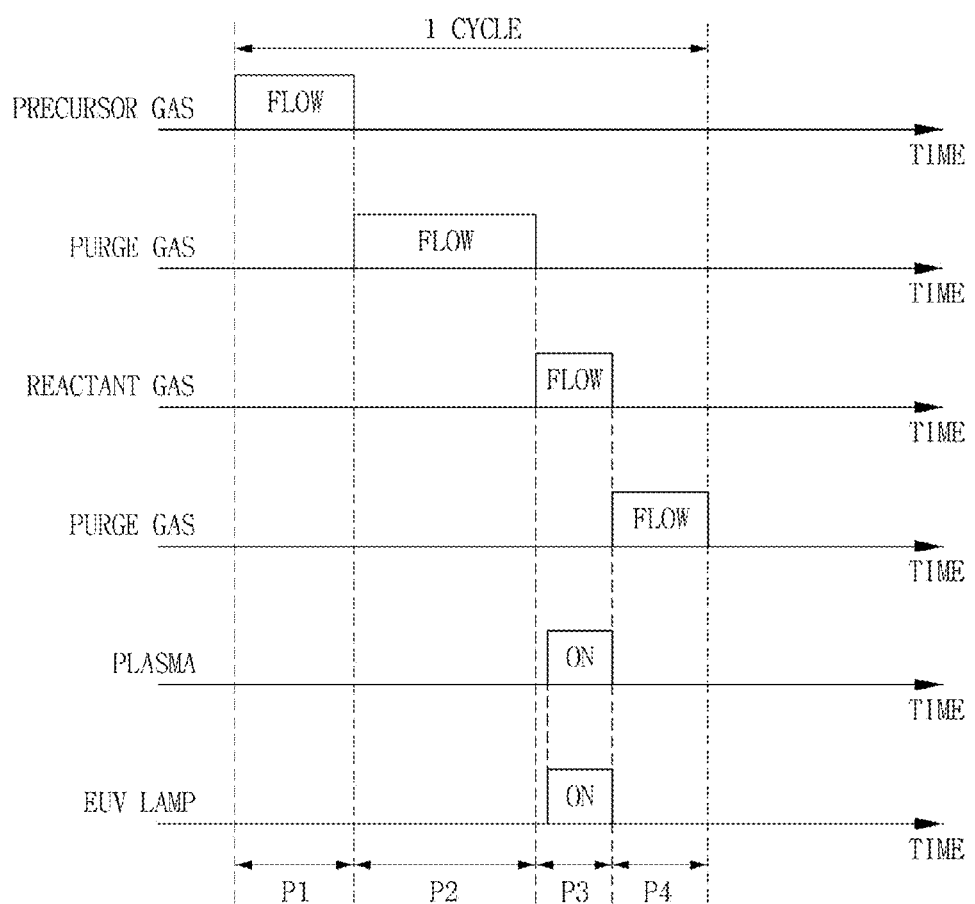
FIG. 3 is a diagram showing a cycle for forming a thin film in accordance with an example embodiment of the inventive concepts.

FIG. 3 is a diagram showing a cycle for forming a thin film in accordance with an example embodiment of the inventive concepts.

Referring to FIG. 3, the cycle for forming a thin film in accordance with the example embodiment of the inventive concepts may be configured to include a period for supplying a precursor gas, a period for supplying a purge gas, a period for supplying a reactant gas, and periods for supplying a purge gas.

During a first period P1, the precursor gas may be supplied into a chamber 110. The precursor gas supplied into the chamber 110 may be adsorbed on a surface of the substrate 1. The first period P1 may be, for example, about 2 to 3 seconds.

During a second period P2, the purge gas may be supplied into the chamber 110. The purge gas may discharge the precursor gas remaining in the chamber 110 to the outside of the chamber 110. The second period P2 may be longer than the first period P1 in order for the precursor gas remaining in the chamber 110 to be substantially completely discharged to the outside of the chamber 110. The second period P2 may be, for example, about 10 seconds or less.

During a third period P3, the reactant gas may be supplied into the chamber 110. Plasma may be generated using the reactant gas while the reactant gas is being supplied into the chamber 110. Referring to FIG. 3, the time for generating plasma may be shorter than the time for supplying the reactant gas into the chamber 110. Further, the generation of plasma may start later than the supply of the reactant gas. When plasma is generated after the reactant gas is supplied into the chamber 110, the plasma may be generated after process conditions, for example, a pressure and/or flow rate of the reactant gas, are stabilized. Accordingly, the plasma can be stably generated.

Further, while generating the plasma, EUV light may be radiated into the chamber 110. The EUV light radiated into the chamber 110 can dissociate recombined radicals and/or retard recombination of the radicals. The radicals (which include the dissociated ones) having strong reactivity may react with the precursors adsorbed on the surface of the substrate 1 to form a thin film. Referring to FIG. 3, the generation of plasma and the radiation of EUV light into the chamber 110 may start at the same time. Further, the generation of plasma and the radiation of EUV light into the chamber 110 may be performed for the same amount of time (e.g., an "ON" period which is slightly shorter than the third period P3). Further, a EUV lamp 150 may be maintained at an on-state during the "ON" period of the plasma.

During a fourth period P4, the purge gas may be supplied into the chamber 110. The purge gas discharges the reactant gas and plasma remaining in the chamber 110 to the outside of the chamber 110.

By repeating the above-described cycle, the thickness of the thin film formed on the substrate 1 can be controlled.

Figure 4:
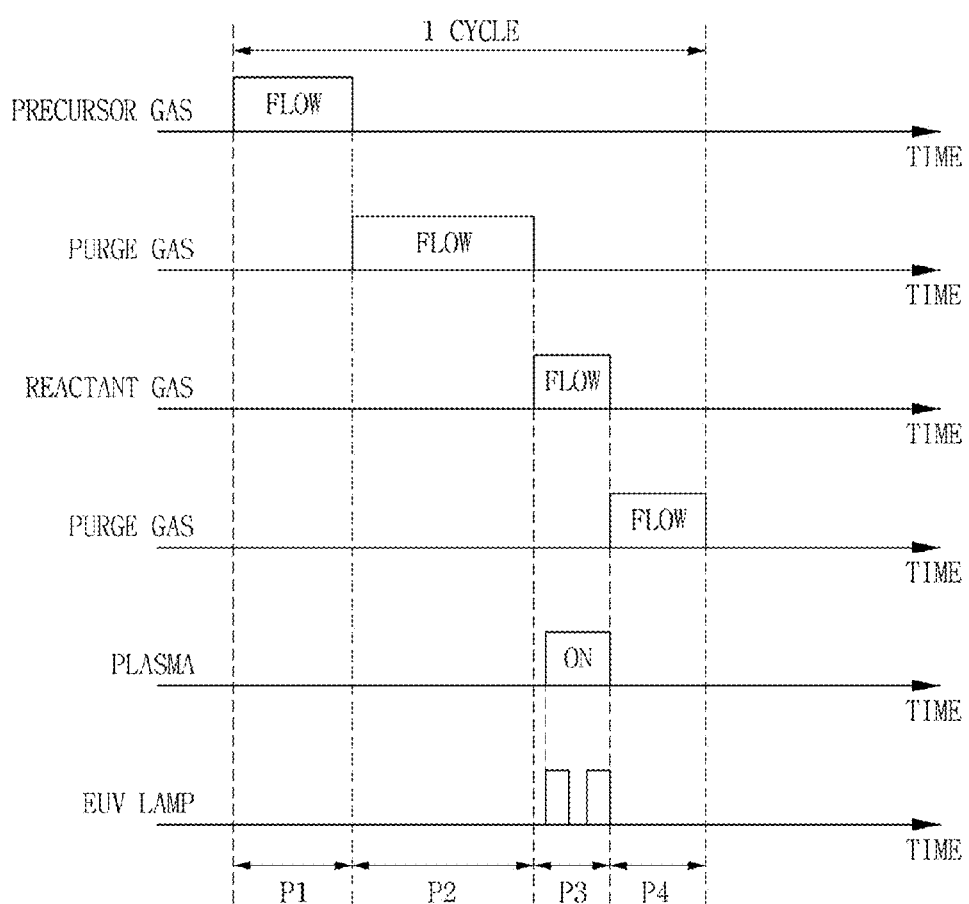
FIG. 4 is a diagram showing a cycle for forming a thin film in accordance with another example embodiment of the inventive concepts.

FIG. 4 is a diagram showing a cycle for forming a thin film in accordance with another example embodiment of the inventive concepts.

The cycle for forming a thin film described in FIG. 4 may be configured to include a first period P1 for supplying a precursor gas, a second period P2 for supplying a purge gas, a third period for supplying a reactant gas, and a fourth period for supplying a purge gas, similar to the cycle for forming a thin film described in FIG. 3. However, The EUV lamp 150 described in FIG. 3 may be maintained at the on-state during the "ON" period of the plasma to keep radiating the EUV light into the chamber 110, whereas the EUV lamp 150 described in FIG. 4 may be turned on/off during the "ON" period of the plasma to radiate the EUV light into the chamber 110 in an alternating manner.

Figure 5A:
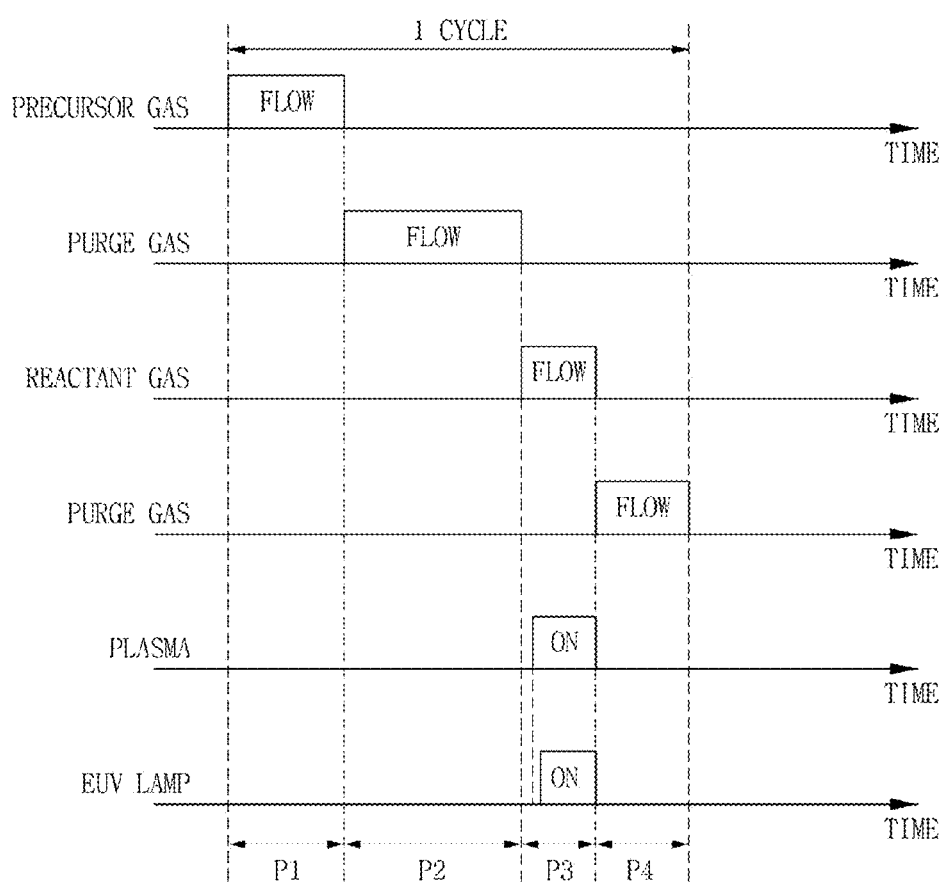
FIGS. 5A and 5B are diagrams showing cycles for forming a thin film in accordance with still other example embodiments of the inventive concepts.
Figure 5B:
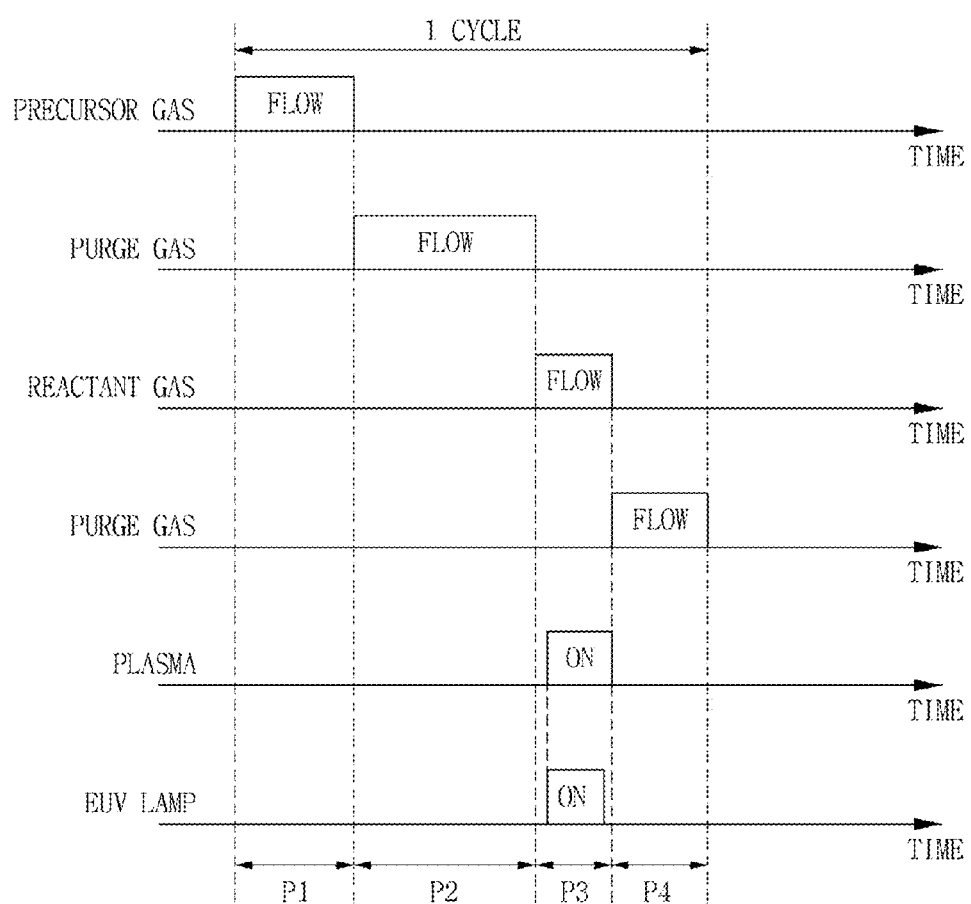

FIGS. 5A and 5B are diagrams showing cycles for forming a thin film in accordance with still other example embodiments of the inventive concepts.

The cycle for forming a thin film described in FIG. 5A may be configured to include a first period P1 for supplying a precursor gas, a second period P2 for supplying a purge gas, a third period P3 for supplying a reactant gas during a third period P3, and a fourth period P4 for supplying a purge gas, similar to the cycle for forming a thin film described in FIG. 3. However, a time period for generating the plasma may be different from a time period for radiating the EUV light into the chamber 110. In FIG. 3, the time period for generating may be the same as the time period for radiating the EUV light into the chamber, whereas in FIG. 5A, the time period for radiating the EUV light into the chamber 110 may be performed for a shorter time than the time period for generating the plasma. FIG. 5A shows that the radiation of EUV light into the chamber 110 may start later than the generation of plasma. Referring to FIG. 5B, the radiation of EUV light into the chamber 110 may start at the same time as the generation of plasma, and stop before completing the plasma generation.

Figure 6A:
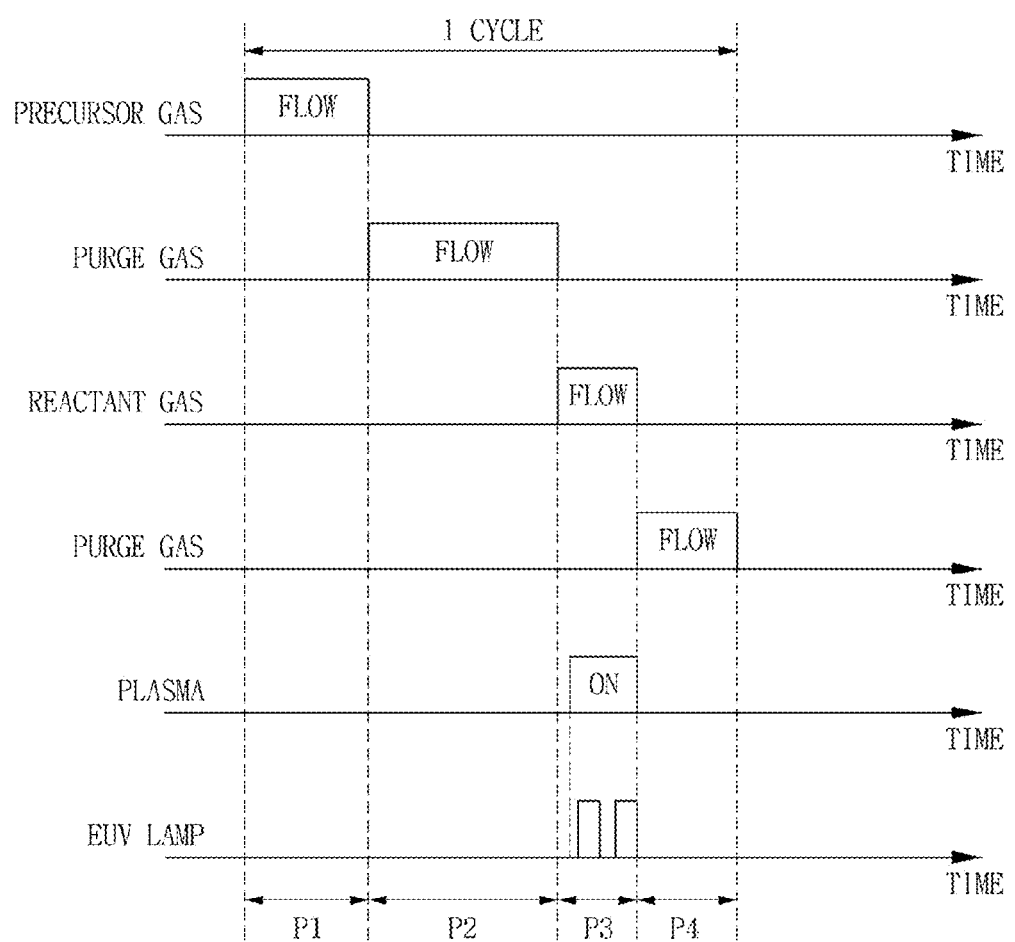
FIGS. 6A and 6B are diagrams showing cycles for forming a thin film in accordance with yet other example embodiments of the inventive concepts.
Figure 6B:
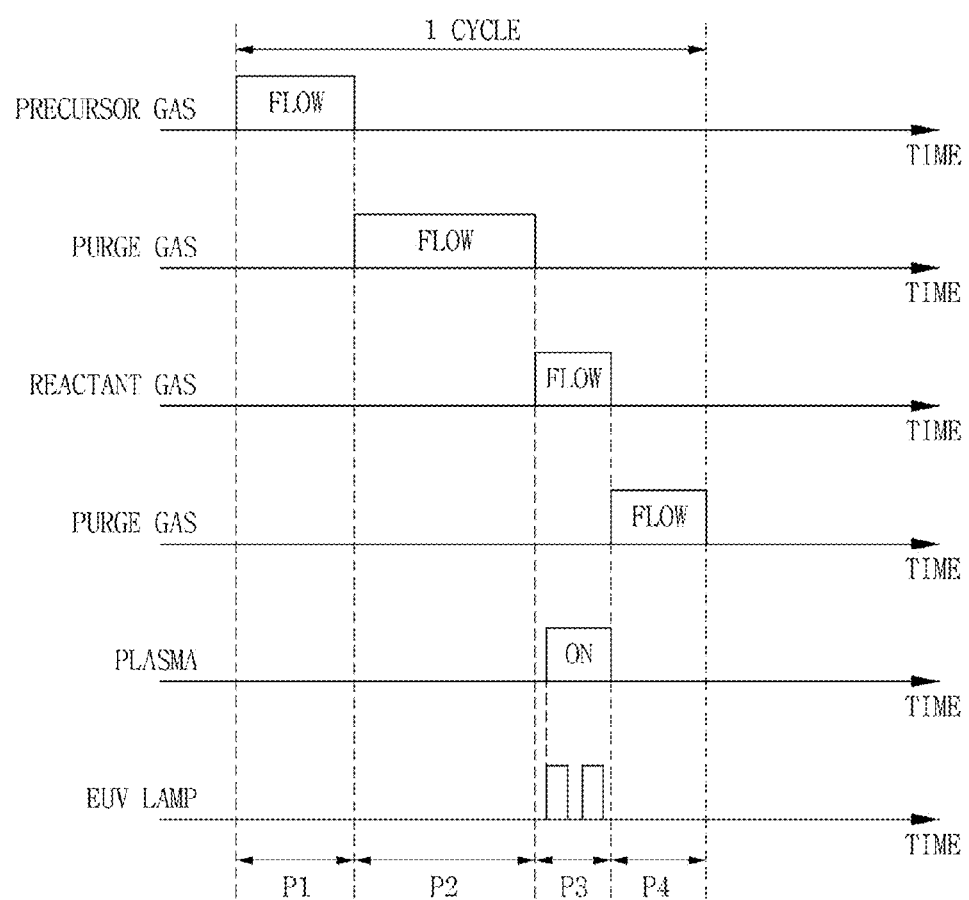

FIGS. 6A and 6B are diagrams showing cycles for forming a thin film in accordance with yet other example embodiments of the inventive concepts.

In the cycle for forming a thin film described in FIG. 6A, the radiation of EUV light into the chamber 110 may be performed for a shorter time than the generation of the plasma, similar to the cycle for forming a thin film described in FIG. 5A. However, the operation of the EUV lamp 150 radiating the EUV light into the chamber 110 may be different. In FIG. 5A, the EUV lamp 150 may be maintained at the on-state during the "ON" period of the plasma to keep radiating the EUV light into the chamber 110, whereas in FIG. 6A, the EUV lamp 150 may be turned on/off during the "ON" period of the plasma to keep radiating the EUV light into the chamber 110. FIG. 6A shows that the radiation of the EUV light into the chamber 110 may start later than the generation of plasma. Referring to FIG. 6B, the radiation of EUV light into the chamber 110 may start at the same time as the generation of plasma, and stop before completing the plasma generation.

FIGS. 7, 8A, 9A, 10A, 11A, 12, and 13 are cross-sectional views for describing a shallow trench isolation (STI) forming process using a thin film forming method in accordance with an example embodiment of the inventive concepts and FIGS. 8B, 9B, 10B, and 11B are enlarged views of an area A denoted by a dotted circle in FIGS. 8A, 9A, 10A, and 11A, respectively.

Figure 7:
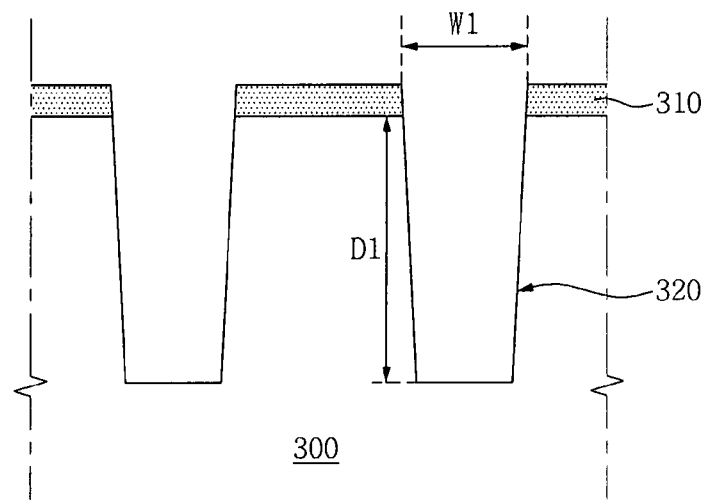
FIGS. 7, 8A, 9A, 10A, 11A, 12, and 13 are cross-sectional views for describing a shallow trench isolation (STI) forming process using a thin film forming method in accordance with an example embodiment of the inventive concepts

Referring to FIG. 7, the STI process may include forming a trench 320 in a substrate 300 (e.g., corresponding to the substrate 1 placed in the chamber 110, as illustrated in FIGS. 1A-1C) using a patterned mask layer 310. The substrate 300 may be a wafer for fabricating a semiconductor device. For example, the substrate 300 may be a single crystalline silicon wafer, a silicon-on-insulator (SOI) wafer, or a compound semiconductor wafer. The patterned mask layer 310 may include a photoresist. The photoresist may be, for example, a polymer photoresist or a small molecular photoresist. The trench 320 may be formed to have a first width W1 and a first depth D1 in the substrate 300.

Referring to FIGS. 8A to 11B, the STI process may include forming a trench liner layer 330' on the substrate 300. The formation of the trench liner layer 330' may include using a PEALD process in accordance with an example embodiment of the inventive concepts.

Figure 8A:
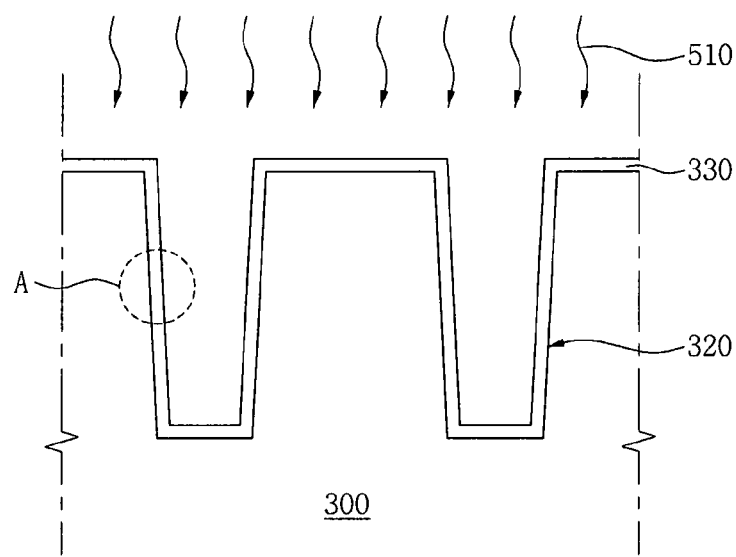
Figure 8B:
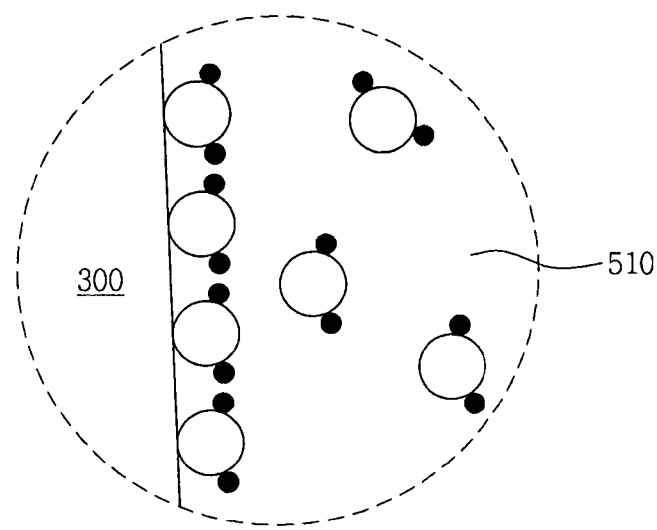
FIGS. 8B, 9B, 10B, and 11B are enlarged views of an area A denoted by a dotted circle in FIGS. 8A, 9A, 10A, and 11A, respectively.

Referring to FIGS. 8A and 8B, the formation of the trench liner layer 330' may include supplying a precursor gas 510 into the chamber 110. When the precursor gas 510 is supplied into the chamber 110, the precursor gas 510 may be adsorbed on a surface of the substrate 300, a bottom of the trench 320, and a sidewall of the trench 320 to form a precursor layer 330. Then, when a purge gas is supplied into the chamber 110, the precursor gas 510 remaining in the chamber 110 may be discharged to the outside of the chamber 110.

Figure 9A:
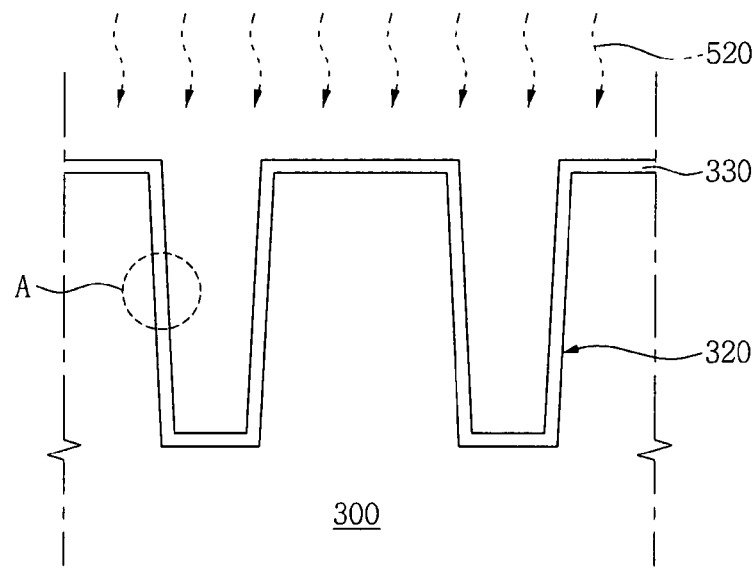
Figure 9B:
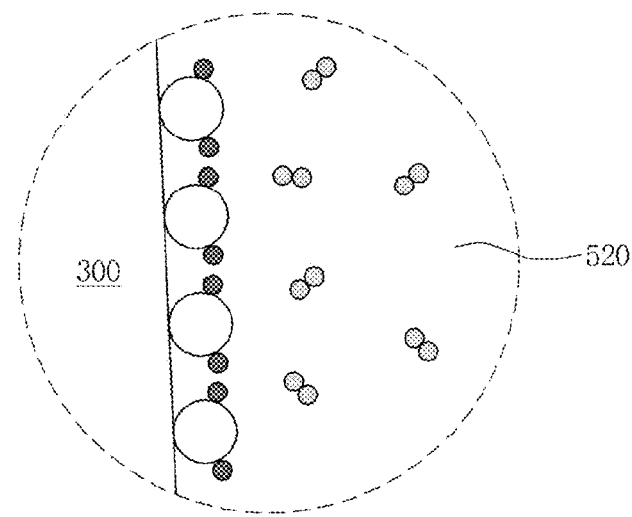

Referring to FIGS. 9A and 9B, the formation of the trench liner layer 330' may include supplying a reactant gas 520 into the chamber 110. The reactant gas 520 supplied into the chamber 110 may diffuse to the surface of the substrate 300, the bottom of the trench 320, and the sidewall of the trench 320.

Figure 10A:
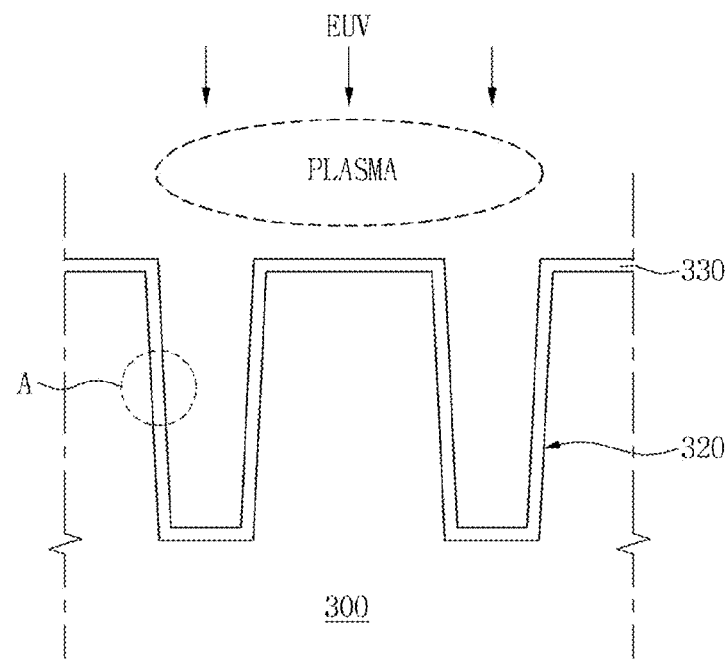
Figure 10B:
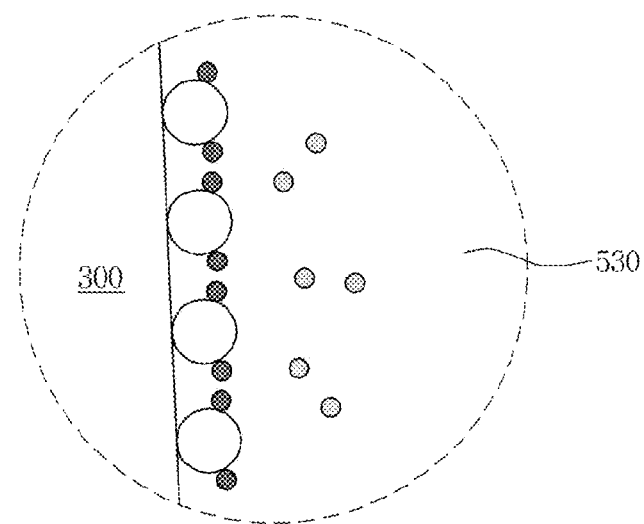

Referring to FIGS. 10A and 10B, the trench liner layer 330' may be formed by using a chemical reaction between the plasma generated based on the reactant gas 520 and the precursor gas 510 adsorbed on the surface of the substrate 300 (e.g., the precursor layer 330), while radiating EUV light into the chamber 110 in accordance with the methods illustrated in FIGS. 2 to 6B. The generated plasma may include radicals. The radicals may react with the precursor layer 330 formed on the surface of the substrate 300, the bottom of the trench 320, and the sidewall of the trench 320. The radicals in the plasma may recombine. The recombined radicals can be dissociated by radiating EUV light into the chamber 110. The dissociated radicals 530 may react with the precursor layer 330 formed on the surface of the substrate 300, the bottom of the trench 320, and the sidewall of the trench 320.

Figure 11A:
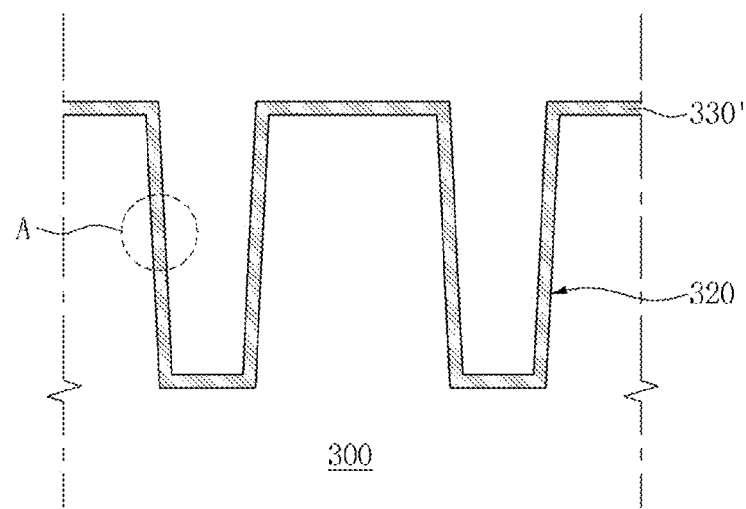
Figure 11B:
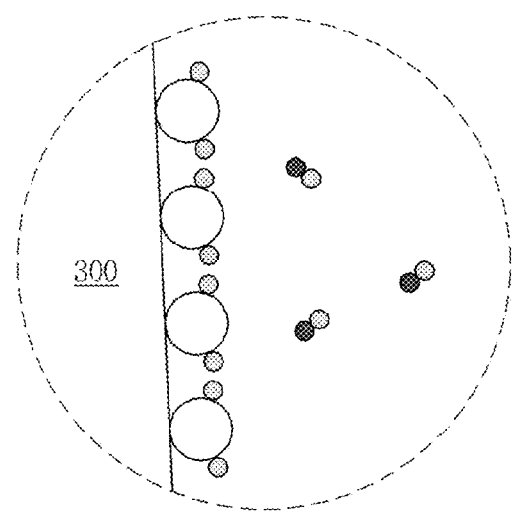

Referring to FIGS. 11A and 11B, the radicals may react with the precursor layer 330 to form the trench liner layer 330' on the surface of the substrate 300, the bottom of the trench 320, and the sidewall of the trench 320. The trench liner layer 330' may be formed to have a small thickness in the range of several tens of angstroms (Å). When a purge gas is supplied into the chamber 110, the reactant gas and plasma remaining in the chamber 110 may be discharged to the outside of the chamber 110.

Figure 12:
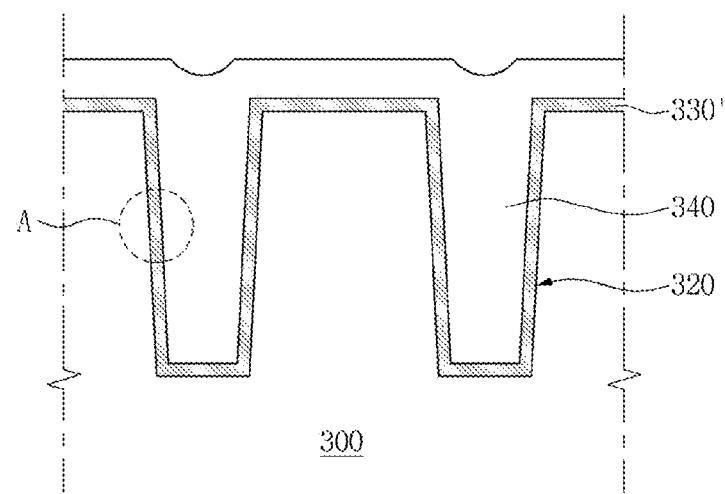

Referring to FIG. 12, the STI process may include forming an insulating material layer 340 on the trench liner layer 330'. Here, the insulating material layer 340 may be formed to fully fill the trench 320. The insulating material may have flowability. For example, the insulating material may include an organic solvent (e.g., a solvent).

Figure 13:
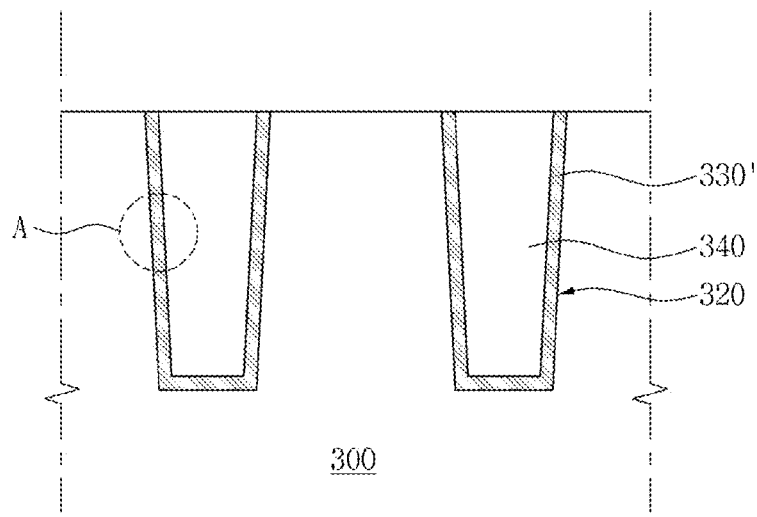

Referring to FIG. 13, the STI process may include polishing the surface of the substrate 300. For example, the surface of the substrate 300 may be polished by a chemical mechanical polishing (CMP) process. The CMP process is a process of planarizing or removing a thin film deposited on a substrate by polishing the thin film using a chemical and physical work. When the surface of the substrate 300 is polished, the insulating material layer 340 and the trench liner layer 330' formed under the insulating material layer 340 may be sequentially removed.

FIGS. 14 to 21 are cross-sectional views for describing a through-silicon-via (TSV) process using a method of forming a thin film in accordance with an example embodiment of the inventive concepts including enlarged views of an area B.

Figure 14:
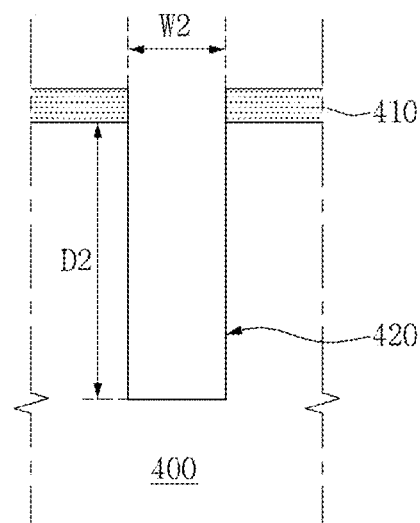
FIGS. 14 to 21 are cross-sectional views for describing a through-silicon-via (TSV) process using a method of forming a thin film in accordance with an example embodiment of the inventive concepts and enlarged views of an area B.

Referring to FIG. 14, the TSV process may include forming a hole 420 in a substrate 400 (e.g., corresponding to the substrate 1 placed in the chamber 110, as illustrated in FIGS. 1A-1C) using a patterned mask layer 410. The substrate 400 may be a wafer for fabricating a semiconductor device. For example, the substrate 400 may be a single crystalline silicon wafer, an SOI wafer, or a compound semiconductor wafer. The patterned mask layer 410 may include, for example, a photoresist. The photoresist may be, for example, a polymer photoresist or a small molecular photoresist. The hole 420 may be formed to have a second width W2 and a second depth D2 in the substrate 400. The second width W2 may be wider than the first width W1 of FIG. 7. The second depth D2 may be deeper than the first depth D1 of FIG. 7.

Referring to FIGS. 15A to 18B, the TSV process may include forming a hole liner layer 430' on the substrate 400. The formation of the hole liner layer 430' may include using a PEALD process in accordance with an example embodiment of the inventive concepts.

Figure 15A:
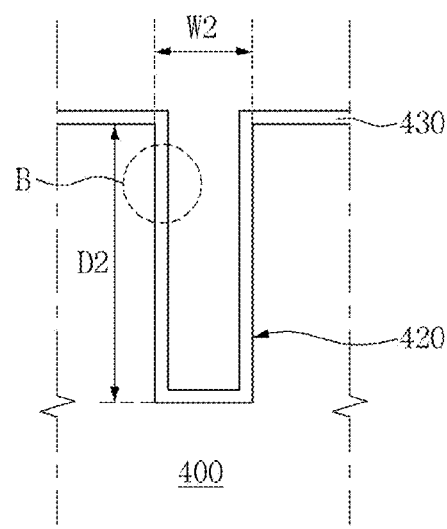
Figure 15B:
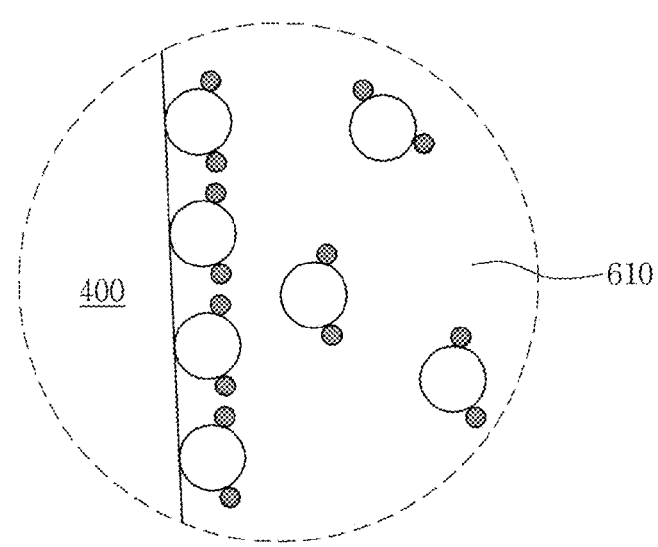

Referring to FIGS. 15A and 15B, the formation of the hole liner layer 430' may include supplying a precursor gas 610 into the chamber 110. When the precursor gas 610 is supplied into the chamber 110, the precursor gas may be adsorbed on a surface of the substrate 400, a bottom of the hole 420, and a sidewall of the hole 420 to form a precursor layer 430. Then, when a purge gas is supplied into the chamber 110, the precursor gas 610 remaining in the chamber 110 may be discharged to the outside of the chamber 110.

Figure 16A:
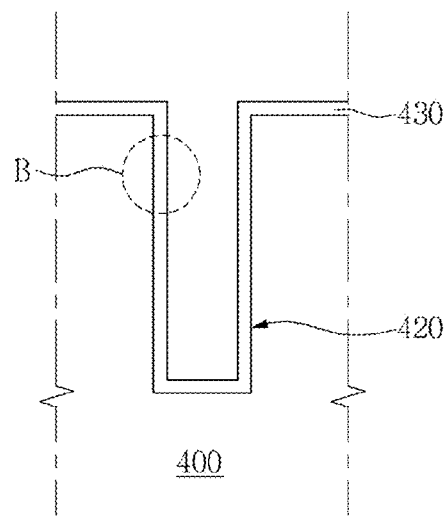
Figure 16B:
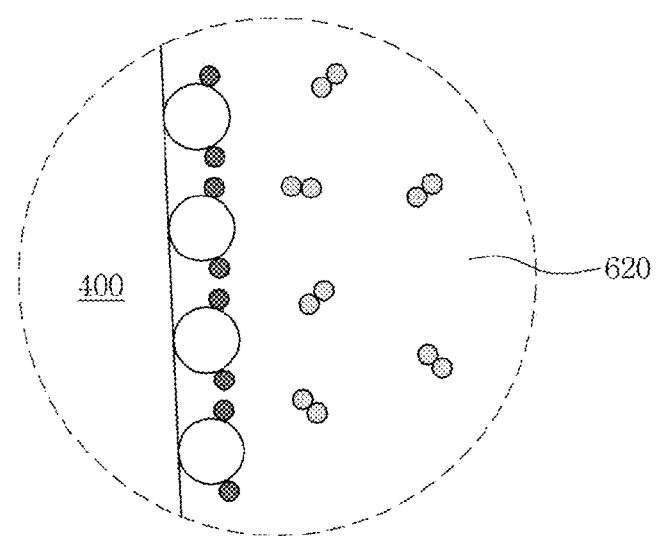

Referring to FIGS. 16A and 16B, the formation of the hole liner layer 430' may include supplying a reactant gas 620 into the chamber 110. The reactant gas 620 supplied into the chamber 110 may diffuse to the surface of the substrate 400, the bottom of the hole 420, and the sidewall of the hole 420.

Figure 17A:
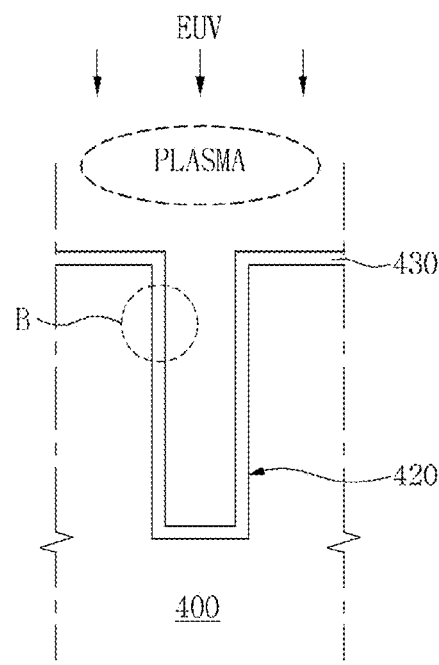
Figure 17B:
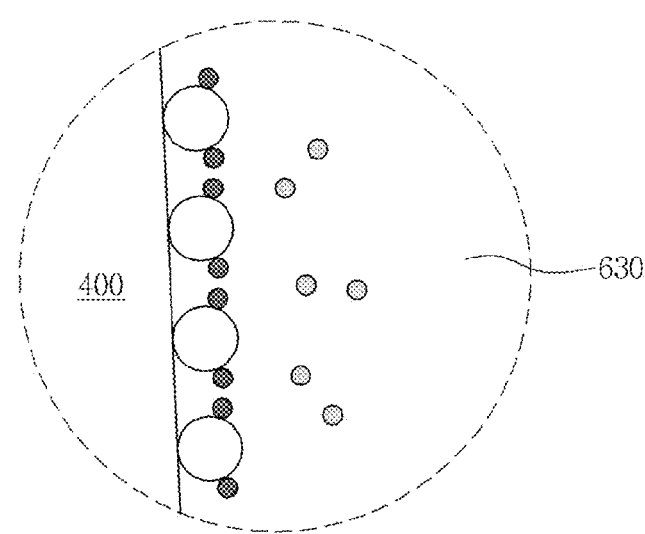

Referring to FIGS. 17A and 17B, the formation of the hole liner layer 430' may include generating plasma and radiating EUV light into the chamber 110. When the plasma is generated, radicals may be formed in the plasma. The generated radicals may react with the precursor layer 430 formed on the surface of the substrate 400, the bottom of the hole 420, and the sidewall of the hole 420. The radicals generated by the plasma may recombine. The recombined radicals can be dissociated by radiating EUV light into the chamber 110. The dissociated radicals 630 may react with the precursor layer 430 formed on the surface of the substrate 400, the bottom of the hole 420, and the sidewall of the hole 420.

Figure 18A:
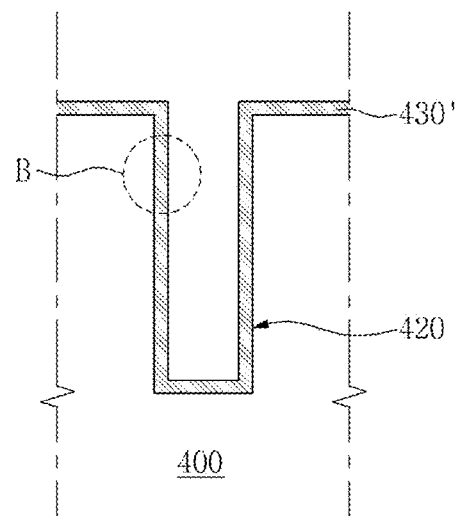
Figure 18B:
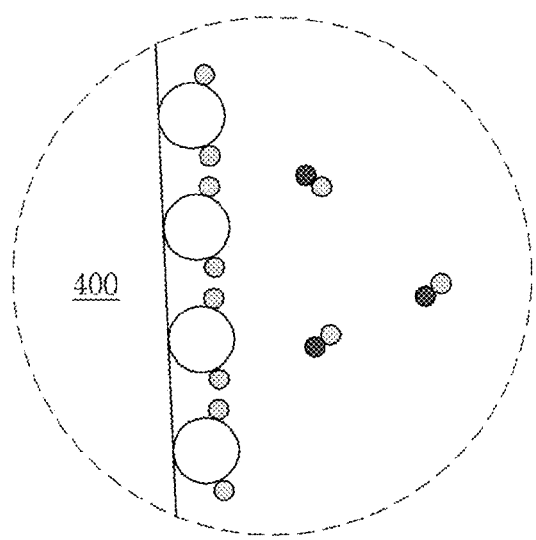

Referring to FIGS. 18A and 18B, the radicals react with the precursor layer 430 to form the hole liner layer 430' on the surface of the substrate 400, the bottom of the hole 420, and the sidewall of the hole 420. The hole liner layer 430' may be formed to have a small thickness in the range of several tens of angstroms (Å). When a purge gas is supplied into the chamber 110, the reactant gas and plasma remaining in the chamber 110 may be discharged to the outside of the chamber 110.

Figure 19:
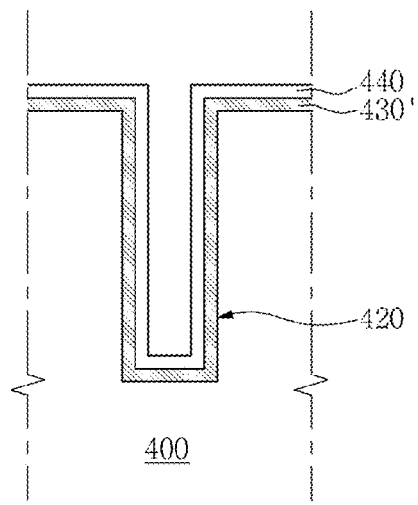

Referring to FIG. 19, the TSV process may include forming a barrier metal layer 440 on the hole liner layer 430'. The barrier metal layer 440 may be formed using, for example, a physical vapor deposition (PVD) process or a chemical vapor deposition (CVD) process. For example, the barrier metal layer 440 may include titanium (Ti), titanium nitride (TiN), tantalum (Ta), or tantalum nitride (TaN).

Figure 20:
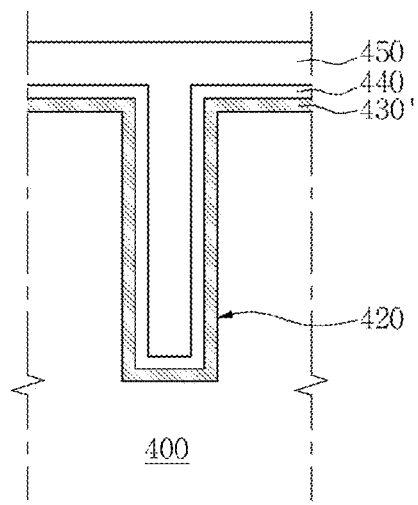

Referring to FIG. 20, the TSV process may include forming an interconnection material layer 450 on the barrier metal layer 440. The interconnection material layer 450 may be formed to fully fill the hole 420. The interconnection material layer 450 may be formed using, for example, an electroplating method. The interconnection material may include, for example, copper (Cu).

Figure 21:
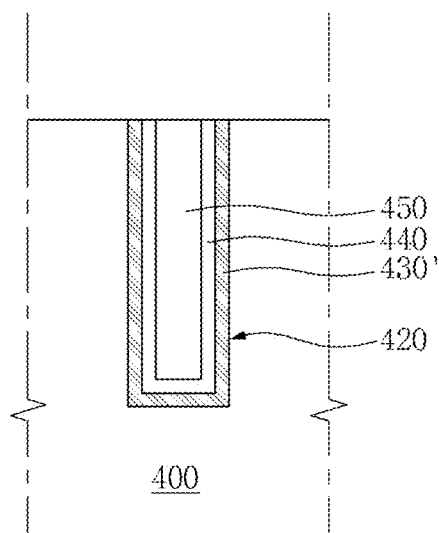

Referring to FIG. 21, the TSV process may include polishing the surface of the substrate 400. The surface of the substrate 400 may be polished by, for example, a CMP process. When the surface of the substrate 400 is polished, the interconnection material layer 450, the barrier metal layer 440 formed under the interconnection material layer 450, and the hole liner layer 430' formed under the barrier metal layer 440 may be sequentially removed.

So far, the formation of a thin film using a PEALD process has been described. However, a thin film may be formed using an ALD process in the thin film forming apparatus 100 in accordance with an example embodiment of the inventive concepts. When a thin film is formed using the ALD process, the process of generating plasma from the reactant gas may be omitted.

According to methods of forming a thin film of a semiconductor device in accordance with various example embodiments of the inventive concepts, when forming a thin film using a PEALD process, lifetime of radicals generated by plasma can increase, resulting in forming a thin film having excellent isotropy on a nanostructured substrate.

The foregoing is illustrative of some example embodiments and is not to be construed as limiting thereof. Although a few example embodiments have been described, those skilled in the art will readily appreciate that many modifications are possible without materially departing from the novel teachings and advantages of the inventive concepts. Accordingly, all such modifications are intended to be included within the scope of the inventive concepts as defined in the claims. In the claims, means-plus-function clauses are intended to cover the structures described herein as performing the recited function, and not only structural equivalents but also equivalent structures.

What is claimed is:

1. A method of forming a thin film of a semiconductor device, comprising:
    forming a precursor layer on a surface of a substrate by supplying a precursor gas into a chamber;
    discharging the precursor gas remaining in the chamber to an outside of the chamber by supplying a purge gas into the chamber;
    supplying a reactant gas into the chamber;
    generating plasma based on the reactant gas;
    forming a thin film by a chemical reaction between the plasma and the precursor layer and radiating extreme ultraviolet (EUV) light into the chamber; and
    discharging the reactant gas and the plasma remaining in the chamber by supplying a purge gas into the chamber,
    wherein a time period for generating the plasma is shorter than a time period for supplying the reactant gas,
    wherein a starting point of the time period for generating the plasma is later than a starting point of the time period for supplying the reactant gas into the chamber, and
    wherein a time period for radiating the EUV light into the chamber is shorter than the time period for generating the plasma based on the reactant gas.

2. The method of claim 1, wherein radiating the EUV light includes maintaining an EUV lamp at an on-state during the time period for generating the plasma.

3. The method of claim 1, wherein radiating the EUV light includes repeatedly turning on and off an EUV lamp during the time period for generating the plasma to radiate the EUV light into the chamber in an alternating manner.

4. The method of claim 1, wherein a starting point of the time period for radiating the EUV light into the chamber is later than the starting point of the time period for generating the plasma.

5. The method of claim 1, wherein a starting point of the time period for radiating the EUV light into the chamber is same as the starting point of the time period for generating the plasma.

6. The method of claim 1, wherein radiating the EUV light includes maintaining an EUV lamp at an on-state during the time period for generating the plasma.

7. The method of claim 1, wherein radiating the EUV light includes repeatedly turning on and off an EUV lamp during the time period for generating the plasma to radiate the EUV light into the chamber in an alternating manner.

8. The method of claim 1, wherein the EUV light includes a Lyman-alpha line.

9. A method of forming a thin film of a semiconductor device, comprising:
    forming a precursor layer on a surface of a substrate;
    discharging the precursor gas remaining in the chamber to an outside of the chamber;
    supplying a reactant gas into the chamber;
    generating plasma based on the reactant gas; and
    forming a thin film using a chemical reaction between the reactant gas and the precursor layer while radiating extreme ultraviolet (EUV) light into the chamber,
    wherein a time period for generating the plasma is shorter than a time period for supplying the reactant gas,
    wherein a starting point of the time period for generating the plasma is later than a starting point of the time period for supplying the reactant gas into the chamber,
    wherein a time period for radiating the EUV light into the chamber is same as the time period for generating the plasma, and
    wherein radiating the EUV light includes repeatedly turning on and off an EUV lamp during the time period for generating the plasma to radiate the EUV light into the chamber in an alternating manner.

10. The method of claim 9, wherein the time period for radiating the EUV light is shorter than the time period for supplying the reactant gas.

11. The method of claim 9, wherein the EUV light includes a Lyman-alpha line.

12. The method of claim 9, wherein the reactant gas includes at least one of water ($H_2O$), ozone ($O_3$) and oxygen ($O_2$).

* * * * *